United States Patent
Noguchi et al.

(10) Patent No.: US 8,742,810 B2
(45) Date of Patent: Jun. 3, 2014

(54) PLL (PHASE-LOCKED LOOP)

(75) Inventors: Hiroki Noguchi, Yokohama (JP); Keiko Abe, Yokohama (JP); Shinichi Yasuda, Tokyo (JP); Shinobu Fujita, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 13/461,101

(22) Filed: May 1, 2012

(65) Prior Publication Data

US 2013/0027093 A1    Jan. 31, 2013

(30) Foreign Application Priority Data

Jul. 28, 2011   (JP) ................. 2011-166073

(51) Int. Cl.
*H03L 7/06* (2006.01)

(52) U.S. Cl.
USPC .......................................... 327/157; 327/148

(58) Field of Classification Search
USPC ................... 327/148, 157, 147, 156; 375/374
See application file for complete search history.

(56) References Cited

U.S. PATENT DOCUMENTS 7,015,735 B2 *   3/2006   Kimura et al. ................ 327/157

FOREIGN PATENT DOCUMENTS

| JP | 7-131340 | 5/1995 |
| JP | 2000-341117 | 12/2000 |

* cited by examiner

*Primary Examiner* — Hai L Nguyen
(74) *Attorney, Agent, or Firm* — Finnegan, Henderson, Farabow, Garrett & Dunner, L.L.P.

(57) ABSTRACT

One embodiment provides a phase-locked loop (PLL), in which a sequencer controls a loop filter such that, when a signal indicating turning-off of a power supply of the PLL is input thereto, or when a signal indicating turning-on of the power supply of the PLL is input thereto, a resistance value of a first resistance change device in the loop filter is a first resistance value, and that, after the PLL is stabilized, the resistance value of the first resistance change device is a second resistance value which is higher than the first resistance value.

9 Claims, 14 Drawing Sheets

|  | FIRST RESISTANCE CHANGE DEVICE | SECOND RESISTANCE CHANGE DEVICE |
| --- | --- | --- |
| CONDITION 1 | HIGH-RESISTANCE STATE 1 | OFF |
| CONDITION 2 | OFF | HIGH-RESISTANCE STATE 2 |
| CONDITION 3 | LOW-RESISTANCE STATE 1 | OFF |
| CONDITION 4 | OFF | LOW-RESISTANCE STATE 2 |
| CONDITION 5 | HIGH-RESISTANCE STATE 1 | HIGH-RESISTANCE STATE 2 |
| CONDITION 6 | HIGH-RESISTANCE STATE 1 | LOW-RESISTANCE STATE 2 |
| CONDITION 7 | LOW-RESISTANCE STATE 1 | HIGH-RESISTANCE STATE 2 |
| CONDITION 8 | LOW-RESISTANCE STATE 1 | LOW-RESISTANCE STATE 2 |

*Fig. 14*

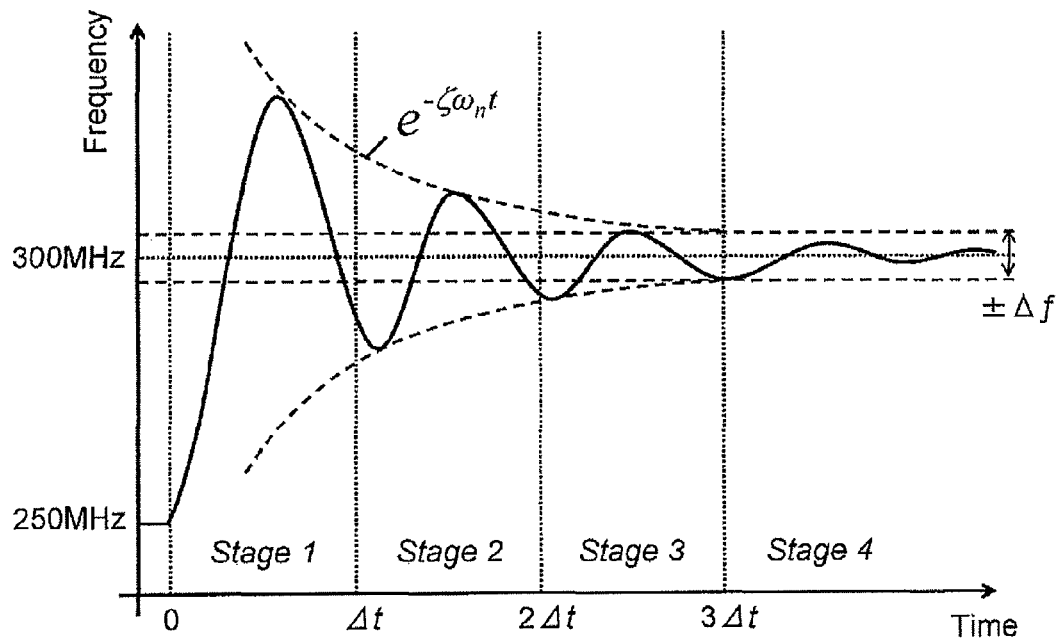

*Fig. 15*

PLL (PHASE-LOCKED LOOP)

CROSS-REFERENCE TO RELATED APPLICATION(S)

This application claims priority from Japanese Patent Application No. 2011-166073 filed on Jul. 28, 2011, the entire contents of which are incorporated herein by reference.

FIELD

Embodiments described herein relate generally to a phase-locked loop (PLL).

BACKGROUND

PLLs are used to accurately obtain various frequencies needed in systems. PLLS are necessarily mounted on general digital large-scale integration (LSI) circuits, such as a central processing unit (CPU) processor, a microcomputer, a digital system-on-chip (SoC), a baseband-processor, and a field programmable gate array (FPGA). The uses of PLLs include keeping generating a constant frequency as in the case of the clock of a microcomputer, and frequently changing frequencies as in the case of wireless communication.

Conventionally, PLLs have been able to substantially meet required specifications only by stably being operated. It has been sufficed that PLLs can obtain high-precision output with less frequency variation and less error. However, in recent years, there has been increased a demand for high-speed response, in addition to a demand for appropriate spectrum purity, i.e., less spurious-signal and less phase noise. More specifically, in digital communication/broadcast, high-speed frequency switching PLLs are required. In the case of the use of frequently switching frequencies, a response characteristic on the time axis, which is difficult to perceive from a frequency characteristic, becomes problematic.

In addition, in order to reduce the electric-power consumption of LSIs, a normally-off type computer has been proposed. In the normally-off type computer, electric-power supplied to each circuit is frequently interrupted. When electric-power is interrupted, a PLL loses a stable operation state. When the PLL is powered again, a time-delay at least in the order of several milliseconds (ms) is caused until an operation of the PLL is stabilized. Although it can be considered to exclude the PLL from targets of the interruption of the supply of electric-power thereto, the consumption electric-current of the PLL is in the order of 10 milliamperes (mA). Thus, if the PLL is excluded from targets of the interruption of the supply of electric-power, the power consumption thereof cannot sufficiently be reduced. If the PLL is designed by placing importance only on the speed-up of the PLL, an output frequency thereof is unstable. Thus, it is difficult to apply the PLL in applications. Consequently, a PLL with stability and fast response capability has been desired.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIG. 14 illustrates states of a resistance change device of the PLL according to the second embodiment.
FIG. 15 illustrates change in the resistance value of the loop filter provided in the PLL according to the second embodiment.

DETAILED DESCRIPTION

One embodiment provides a phase-locked loop (PLL), including: a phase detector configured to detect a phase difference between a reference signal and a feedback signal and output a first signal based on the phase difference; a charge pump configured to generate electric-current based on the first signal; a loop filter connected to the charge pump and output a second signal converted from the electric current, the loop filter having a first resistance change device; a voltage-controlled oscillator (VCO) configured to control an output frequency thereof according to the second signal input thereto from the loop filter; a frequency divider configured to perform frequency-dividing of an output signal of the VCO and to generate a feedback signal to be input to the phase detector; and a sequencer configured to control the loop filter, wherein the sequencer controls the loop filter such that, when a signal indicating turning-off of a power supply of the PLL is input thereto, or when a signal indicating turning-on of the power supply of the PLL is input thereto, a resistance value of the first resistance change device is a first resistance value, and that, after the PLL is stabilized, the resistance value of the first resistance change device is a second resistance value which is higher than the first resistance value.

First Embodiment

Figure 1:
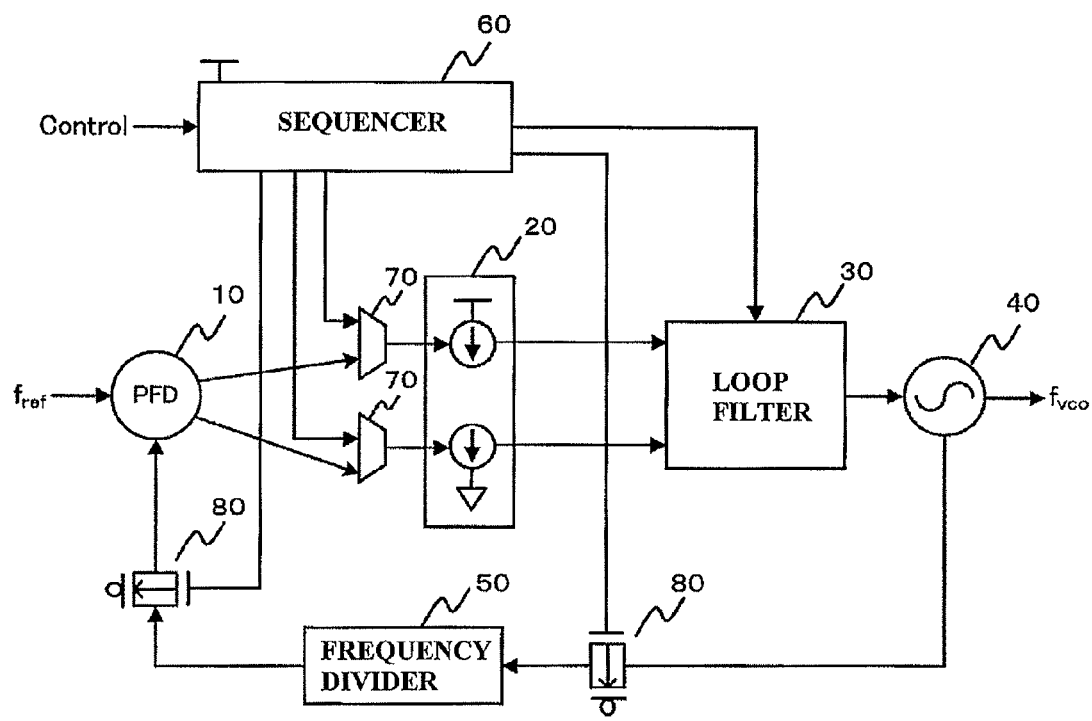
FIG. 1 illustrates a PLL according to a first embodiment.

Hereinafter, an embodiment is described with reference to the drawings. FIG. 1 illustrates a PLL according to the present embodiment. The PLL includes a phase detector 10, a charge pump 20, a loop filter 30, a VCO 40, a frequency divider 50, a sequencer 60, multiplexers 70, and switches 80.

The PLL generates a signal $f_{vco}$ having a frequency which is N-times that of a reference signal $f_{ref}$. A reference signal $f_{ref}$ and a feedback signal $f_{div}$ are input to the phase detector 10 that compares the phases of the reference signal $f_{ref}$ and the feedback signal $f_{div}$ with each other. Then, if the phase of the feedback signal $f_{div}$ advances, the phase detector 10 outputs a voltage drop signal to the charge pump 20 via the multiplexer 70. If the phase of the feedback signal $f_{div}$ lags, the phase detector 10 outputs a boost signal to the charge pump 20 via the multiplexer 70.

The charge pump 20 is driven, based on a signal output from the phase detector 10 and input thereto via the multiplexer 70, and supplies electric-current in a boost direction or a voltage drop direction. Electric-current generated in the charge pump 20 is input to the loop filter 30.

The loop filter 30 converts electric-current generated at the charge pump 20 into a power-supply voltage to be applied to the VCO 40. Then, the loop filter 30 inputs the power-supply voltage to the loop filter 30. The detailed configuration of the loop filter 30 is described below with reference to FIG. 3. The VCO 40 is an oscillating circuit that controls an output frequency according to a voltage input thereto from the loop filter 30. An output of the VCO 40 is made as that of the PLL, and input to the frequency divider 50 via the switch 80.

Figure 2:
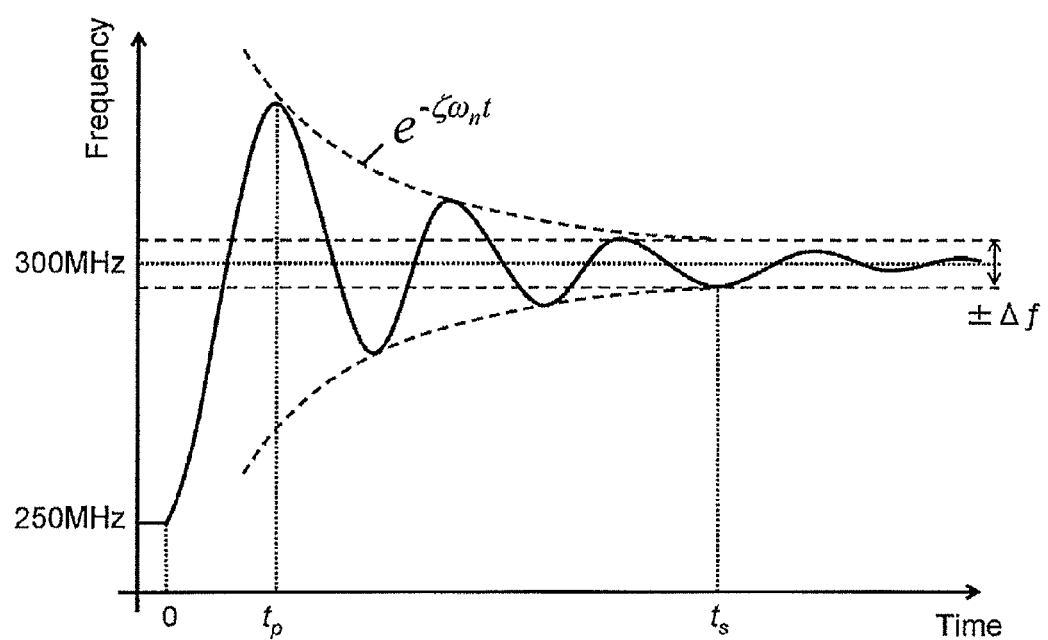
FIG. 2 illustrates change of the frequency of an output signal of the PLL according to the first embodiment.

The frequency divider 50 outputs a signal input thereto by changing the frequency of the input signal into an integral multiple thereof. Generally, the frequency division number of the frequency divider 50 is variable. For example, if the frequency division number of the frequency divider 50 is changed from 250 to 300 during an operation thereof in which the frequency of the reference signal $f_{ref}$ is 1 mega-hertz (MHz), the frequency of the output signal $f_{vco}$ changes from 250 MHz to 300 MHz. FIG. 2 illustrates change of the frequency of the output signal $f_{vco}$ of the PLL. Ringing of a response characteristic occurs since the frequency division number is changed until the frequency of the output signal changes. Thus, it takes time until the frequency of the output signal of the PLL becomes a target frequency. A state in which the difference between the frequency of the output signal of the PLL and the target frequency is within a predetermined range ($\pm \Delta f$) is referred to as a state in which the PLL is locked up (i.e., stabilized). A state in which the difference therebetween exceeds the predetermined range is referred to as an unlocked state. An unlocked state is caused, e.g., when the target frequency or the reference frequency is changed by a request of a processor, or due to the influence of noise. The difference between the frequency of an output signal of the PLL and the target frequency exceeds the predetermined range not only when the PLL is in an unlocked state, but when the power supply for the PLL is turned on again after once turned off.

A delay caused until a PLL is stabilized is due to the fact that the PLL includes a feedback loop. The transfer function of the closed loop of the PLL is expressed by the following function H(s).

$$H(s) = \frac{A\omega_n^2}{s^2 + 2\zeta\omega_n s + \omega_n^2} \quad \text{[Expression 1]}$$

$$\omega_n = \sqrt{\frac{\omega_{LPF} K_{PD} K_{VCO}}{N}}$$

$$\zeta = \frac{1}{2}\frac{\omega_{LPF}}{\omega_n} = \frac{1}{2}\sqrt{\frac{N\omega_{LPF}}{K_{PD}K_{VCO}}}$$

where $K_{VCO}$ represents the gain [radians/seconds/volts (rad/s/V)] or [Hz/V], $K_{PD}$ denotes the gain [V/rad] of the phase detector 10, A represents a gain (steady-state value), $\omega_n$ denotes a natural frequency [rad], $\omega_{LPF}$ denotes the cutoff frequency [rad] of the loop filter, $\zeta$ represents a damping constant (damping factor), and N denotes the frequency division number of the frequency divider 50.

Time taken to stabilize the frequency of an output signal $f_{vco}$ of the PLL is influenced by the time constant of the loop filter 30. The change $\omega_{out}$ ($=2\pi f_{vco}$) of the angular frequency of an output signal $f_{vco}$ of the PLL is given by the following expressions.

$$\omega(t) = A\left[1 - e^{-\zeta\omega_n t}\left\{\cos(\omega_n\sqrt{1-\zeta^2}\,t) + \frac{\omega_n}{\sqrt{1-\zeta^2}}\sin(\omega_n\sqrt{1-\zeta^2}\,t)\right\}\right] \quad \text{[Expression 2]}$$

$$= A\left[1 - \frac{\omega_n}{\sqrt{1-\zeta^2}}\sin(\omega_n\sqrt{1-\zeta^2}\,t+\theta)\right]$$

$$\theta = \tan^{-1}\frac{\sqrt{1-\zeta^2}}{\omega_n}$$

A frequency step-response is a function that oscillates with a period given by the following expression, and attenuates at a time constant of $(\zeta\omega_n)^{-1}$.

$$\omega_n\sqrt{1-\zeta^2} \quad \text{[Expression 3]}$$

To reduce the lock-up time of the PLL, it is advisable to maximize a value of $\zeta\omega_n$. The value of $\zeta\omega_n$ is given by the following expression. Thus, the filter time constant of the loop filter 30 affects the lock-up time of the PLL.

$$\zeta\omega_n = \frac{1}{2}\omega_{LPF} \quad \text{[Expression 4]}$$

However, if the damping constant $\zeta$ is simply increased, the cutoff frequency $\omega_{LPF}$ d of the loop filter becomes high, so that phase noise in an output signal $f_{vco}$ of the PLL is increased. In addition, a spurious-phenomenon occurs, in which a frequency component of the reference signal $f_{ref}$ is mixed into the output signal $f_{vco}$. Accordingly, a stable output that is a basic requirement specific of the PLL cannot be achieved.

Thus, when the PLL is unlocked, or when the power supply of the PLL is turned on, the time constant of the loop filter 30 is set to be small. After the PLL is locked up, the time constant of the loop filter 30 is set to be large. That is, when the PLL is unlocked, or when the power supply of the PLL is turned on, the resistance of the loop filter 30 is set to be low. After the PLL is locked up, the resistance of the loop filter 30 is set to be high. Incidentally, the following description is made by assuming that when the power supply of the PLL is turned on, the time constant of the loop filter 30 is set to be small (that is, the resistance of the loop filter 30 is set to be low). However, the PLL can be configured such that, in the case of turning off the power supply of the PLL, the turning-off of the power supply is performed after the time constant of the loop filter 30 is set to be small, so that when the PLL is activated, the PLL is put into a state in which the time constant is small.

According to the present embodiment, not only when the unlocked state of the PLL including the loop filter 30 is detected, but when the turning-on (or turning-off) of the power supply of the PLL is detected, the resistance of the loop filter 30 is set to be small. Thus, the PLL can be configured such that after the power supply of the PLL is turned on, the time constant of the loop filter 30 is set at a small value before the difference between the frequency of the output signal of the PLL and the target frequency is compared with the predetermined range. Consequently, after the power supply is turned on, the PLL can be brought into a lockup state more quickly.

Thus, in order to control the time constant of the loop filter 30, the sequencer 60, the multiplexers 70, and the switches 80 are provided in the PLL. The loop filter 30 is configured, as illustrated in FIG. 3.

A signal Control is input to the sequencer 60 in a case where an unlocked state occurs (i.e., the reference frequency is changed, or the frequency division number of the frequency divider 50 is changed) when an external control circuit (not shown) makes a power-off request, or where the lockup state of the PLL is detected. The detection of the lockup state is performed by a lockup detector (not shown). Information represented by the signal Control includes the reference frequency, the frequency division number, and other setting items. The sequencer 60 transmits control signals to the loop filter 30, the multiplexers 70, and the switches 80, based on the signal Control. Thus, the time constant of the loop filter 30 is adjusted. In an example illustrated in FIG. 3, the sequencer 60 controls the loop filter 30 by generating, from the signal Control, a signal Normal indicating whether writing to a resistance change type device (briefly, resistance change device) 31 is performed, a signal Write "H" indicating whether the resistance change type device 31 is set in a high-resistance state, and a signal Write "L" indicating whether the resistance change type device 31 is set in a low-resistance state.

Figure 3:
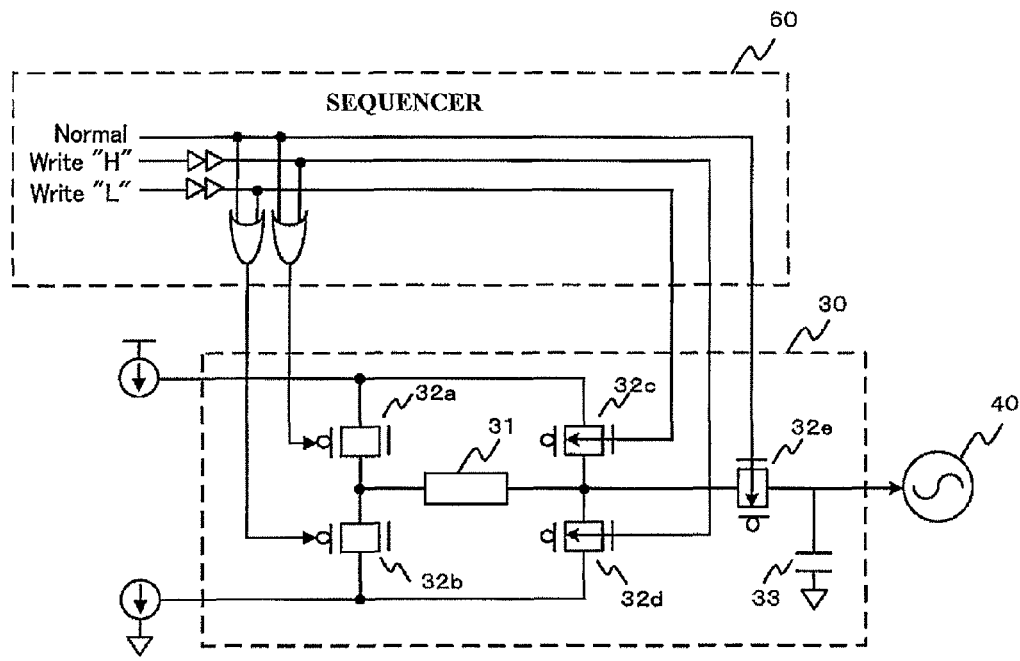
FIG. 3 illustrates a loop filter of the PLL according to the first embodiment.

As illustrated in FIG. 3, the loop filter 30 includes the resistance change type device 31, switches 32a to 32e controlled by the sequencer 60, and a capacitor 33.

Each of the switches 32a to 32e is a switch configured using an n-metal-oxide-semiconductor (nMOS) and a p-metal-oxide-semiconductor (pMOS). The switches 32a and 32c are connected to the charging side of the charge pump 20. The switches 32b and 32d are connected to the discharging side of the charge pump 20. In addition, the switches 32a and 32b are connected to each other. The switches 32c and 32d are connected to each other. Incidentally, in FIG. 3, a signal applied to the nMOS of each of the switches 32a to 32e is shown, while the drawing of a signal applied to the pMOS of each of the switches 32a to 32e is omitted. The reversal value of a value represented by a signal input to each nMOS is applied to an associated pMOS.

The resistance change type device 31 is, e.g., a magnetic tunnel junction (MTJ) of a spin torque transfer random access memory (STT-RAM), a phase change material of a phase change memory (PCM), a resistance change element of a resistance random access memory (ReRAM), a resistance change memory utilizing resistance change due to a field effect, or an ion memory. Hereinafter, a description is made by assuming that the resistance change type device 31 is implemented according to an electric-current writing method. The resistance change type device 31 has one terminal connected to the switches 32a and 32b, and the other terminal connected to the switches 32c and 32d.

The resistance change type device according to the electric-current writing method is a device whose resistance value is set by applying a predetermined electric-current between the terminals of the device. The resistance change type device according to the electric-current writing method is put into a low-resistance state or a high-resistance state, according to the direction of electric-current applied to the device. This embodiment is described by assuming that when electric-current flows from the terminal of the resistance change device 31, which is connected to the switches 32c and 32d, to the terminal thereof connected to the switches 32a and 32b, the resistance change device 31 is put into the low-resistance state, and that when electric-current flows to the terminal of the resistance change device 31, which is connected to the switches 32c and 32d, from the terminal thereof connected to the switches 32a and 32b, the resistance change device 31 is put into the high-resistance state.

When the PLL is unlocked, or when the power supply of the PLL is turned on, the sequencer 60 sets the levels of the signals Normal, Write "H", and Write "L" at "L", "L", and "H", respectively. The signals Write "H" and Write "L" are passed through delay devices, ORed with the signal Normal, and input to the switches 32a and 32b, respectively. The signal Write "H" is input to the switch 32c via the delay device. The signal Write "L" is input to the switch 32d via the delay device. The signal Normal is input to the switch 32e.

Figure 4:
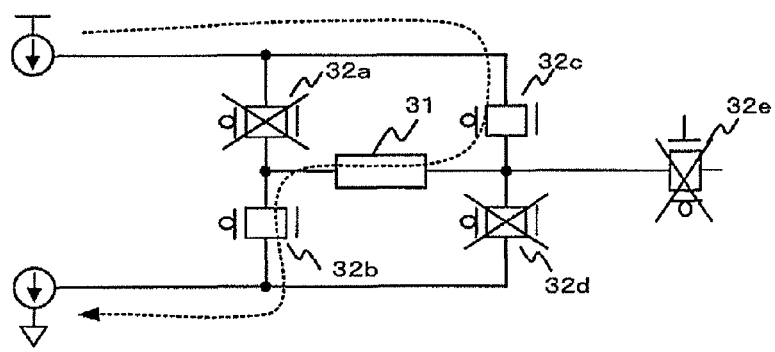
FIG. 4 illustrates an operation of the loop filter of the PLL according to the first embodiment.

Then, the switches 32b and 32c are turned on, while the switches 32a, 32d, and 32e are turned off. Thus, as indicated by a dashed line in FIG. 4, electric-current flows through the switch 32c, the resistance change device 31, and the switch 32b. The magnitude of electric-current can be adjusted according to the length of a pulse input to the charge pump 20. If programmed electric-current is applied as indicated by the dashed line in FIG. 4, the resistance change device 31 is brought into a low-resistance state.

Figure 5:
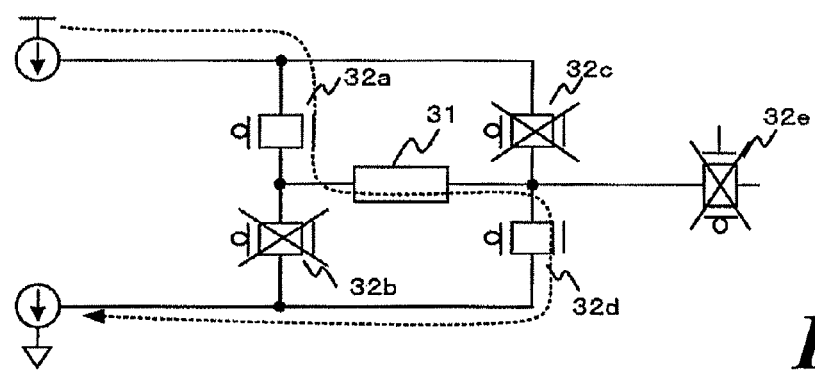
FIG. 5 illustrates an operation of the loop filter of the PLL according to the first embodiment.

On the other hand, when the PLL is locked up, the sequencer 60 sets the levels of the signals Normal, Write "H", and Write "L" at "L", "H", and "L", respectively. Then, the switches 32a and 32d are turned on, while the switches 32b, 32c, and 32e are turned of Thus, as indicated by a dashed line in FIG. 5, electric-current flows, which passes through the switch 32a, the resistance change device 31, and the switch 32d. If the programmed electric-current is applied in the direction indicated by the dashed line in FIG. 5, the resistance change device 31 is brought into a high-resistance state.

If the resistance change device 31 is in the low-resistance state, the time constant of the loop filter 30 is small, as compared with that thereof in the high-resistance state. The cutoff frequency $\omega_{LPF}$ which is the reciprocal of the time constant of the loop filter 30 is large. Thus, the damping constant becomes large. Accordingly, in the low-resistance state, the PLL can quickly be converged, as compared with that in the high-resistance state. However, in the high-resistance state, the PLL can stably be operated by suppressing phase noise and spurious signals, as compared with that in the low-resistance state.

Figure 6:
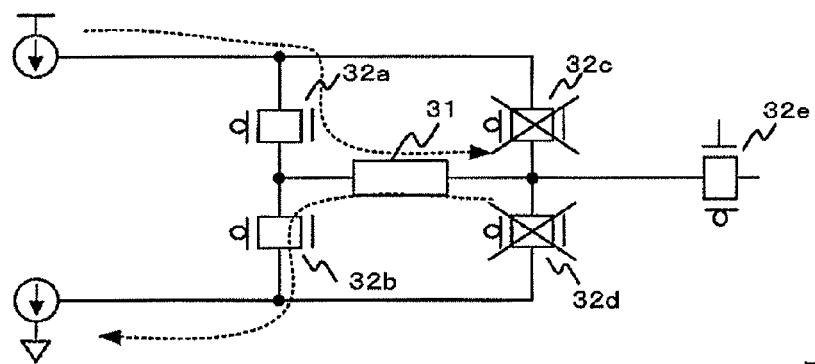
FIG. 6 illustrates an operation of the loop filter of the PLL according to the first embodiment.

In the normal state in which the resistance value of the resistance change device 31 is not changed, the sequencer 60 sets the levels of the signals Normal, Write "H", and Write "L" at "H", "L", and "L", respectively. Then, the switches 32a, 32b, and 32e are turned on, while the switches 32c and 32d are turned off. Thus, as indicated by dashed lines in FIG. 6, electric-current can be caused to flow through the switch 32a, the resistance change device 31, and the switch 32e. Alternatively, electric-current can be caused to flow through the switch 32e, the resistance change device 31, and the switch 32b. That is, according to an output of the phase detector 10, charging or discharging is performed by the charge pump 20, so that a voltage-level applied to the VCO 40 is charged or discharged via the loop filter 30 to or from the level of the electric-potential $V_{VCO}$ of the VCO 40.

At that time, the charge pump 20 performs only charging or discharging. Thus, the electric-current caused to flow to the resistance change device 31 is less in magnitude than the programmed electric-current that is used to write a resistance value to the resistance change device 31. Accordingly, no resistance value is written to the resistance change device 31 normally. Sometimes, charging and discharging occur instantaneously, i.e., substantially at the same time due to the skew of an output of the phase detector 10. Thus, through-electric-current flows therethrough. However, at that time, no electric current flows in the resistance change device 31. Electric-current flows only through the charge pump 20, and the switches 32*a* and 32*b*. Thus, no erroneous writing to the resistance change device 31 occurs.

Figure 7:
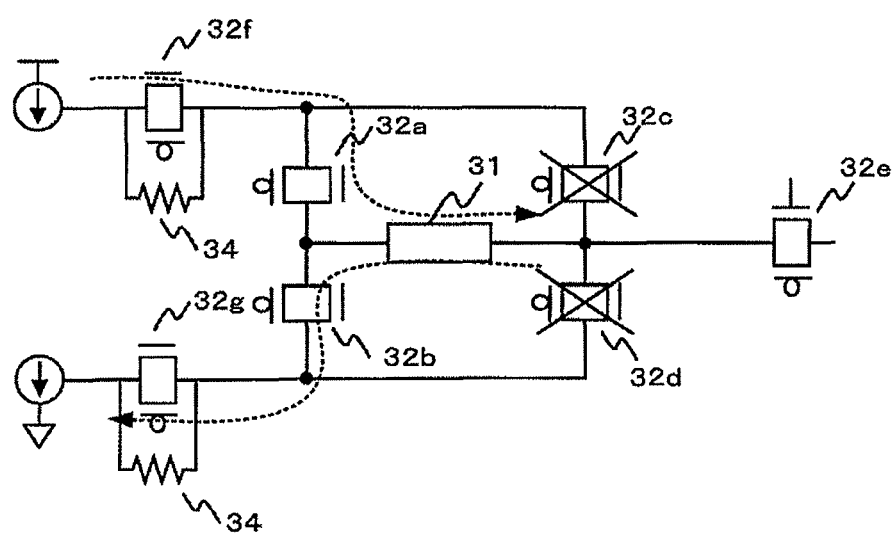
FIG. 7 illustrates a modification of the loop filter of the PLL according to the first embodiment.

However, if a pulse to the charge pump 20 from the phase detector 10 is accidentally lengthened, e.g., just after the activation of the power supply to the PLL, erroneous writing to the resistance change may be performed. Thus, switches 32*f* and 32*g* and each inrush resistance 34 are inserted into the loop filter 30, as illustrated in FIG. 7 to thereby prevent the occurrence of the erroneous writing. The switches 32*f* and 32*g* are turned on/off according to the signal Normal. During a normal operation (in which the level of the signal Normal is "H"), the switches 32*f* and 32*g* are turned off. However, during an operation of writing to the resistance change device 31 (in which the level of the signal Normal is "L"), the switches 32*f* and 32*g* are turned on. Consequently, during the normal operation, an amount of electric-current flowing from the charge pump 20 to the resistance change device 31 is suppressed. Thus, the occurrence of the erroneous writing to the resistance change device 31 can be prevented.

The sequencer 60 also controls the multiplexers 70 and the switches 80 shown in FIG. 1 according to which of the operation of writing to the resistance change device 31, and the normal operation is performed. Each of the multiplexers 70 is provided between the phase detector 10 and the charge pump 20. When the resistance value of the resistance change device 31 is changed, the phase detector 10 and the charge pump 20 are disconnected from each other by the multiplexers 70 to interrupt the feedback loop of the PLL. Each of the multiplexers 70 is a switch that switches output signals according to the signal Normal. During the normal operation (in which the level of the signal Normal is "H"), the multiplexers 70 outputs signals input thereto from the phase detector 10. However, during the operation of writing to the resistance change device 31 (in which the level of the signal Normal is "L"), the multiplexers 70 output signals input thereto from the sequencer 60. The sequencer 60 inputs, when the resistance value of the resistance change device 31 is changed, a writing pulse signal to each of the multiplexers 70 to thereby control the charge pump 20 instead of the phase detector 10.

The switches 80 are provided at the preceding stage of the frequency divider 50 and at that of the phase detector 10, respectively. When the resistance value of the resistance value change device 31 is changed, the sequencer 60 inputs control signals to the switches 80 to turn off the switches 80. The turning-off of the switches 80 can also interrupt the feedback loop of the PLL. Incidentally, each switch 80 can be either a complementary-MOS (CMOS) switch or a resistance change type device whose resistance becomes infinitive.

Thus, the influence of noise due to outputs of the VCO 40 and the phase detector 10 is avoided by interrupting the feedback loop of the PLL when the resistance value of the resistance change device 31 is changed.

In addition, although the feedback loop of the PLL can be interrupted only by the multiplexers 70, the power consumption of the PLL at the time of changing the resistance value of the resistance change device 31 can be reduced using the switches 80 in addition to the multiplexers 70 to interrupt the feedback loop of the PLL. This is because of the fact that the operations of the phase detector 10 and the frequency divider 50, which digitally operate, are stopped.

Figure 8:
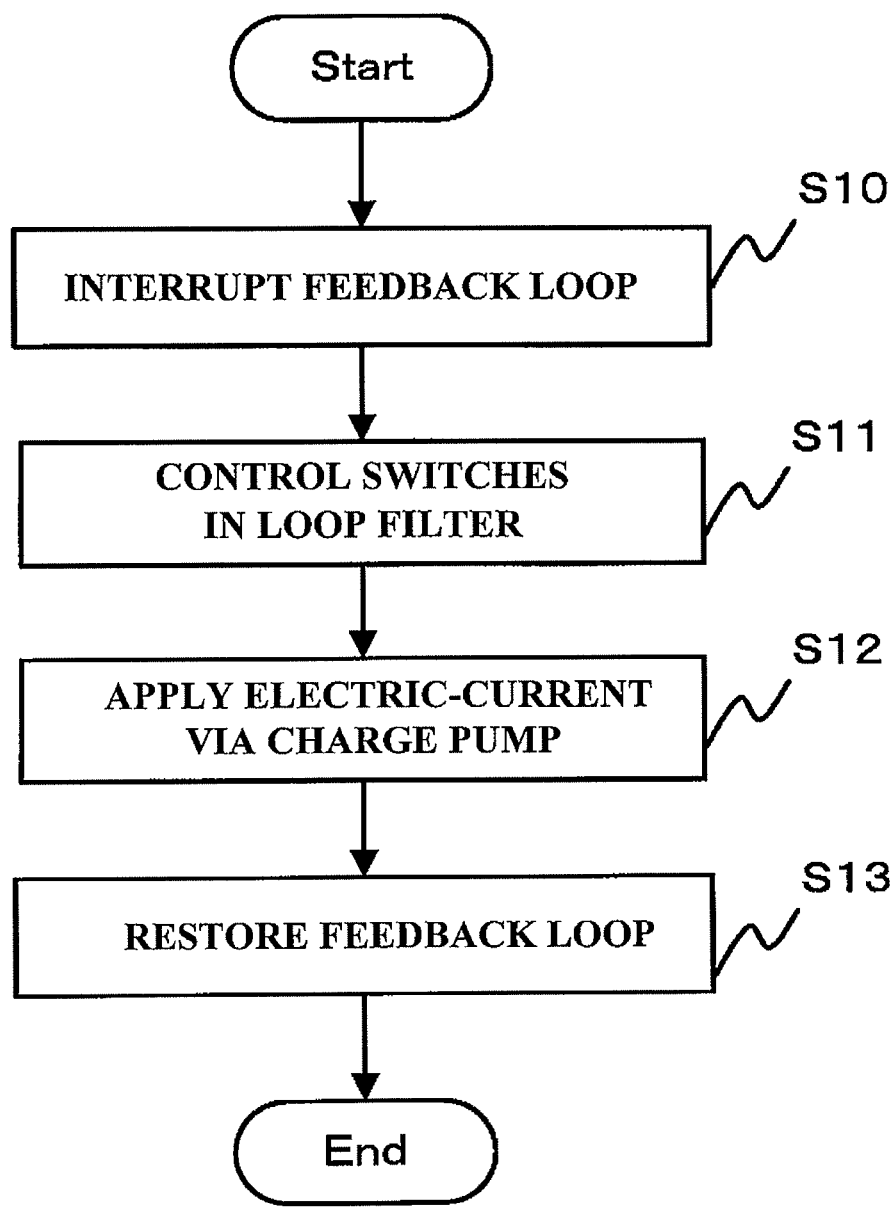
FIG. 8 illustrates a process in the PLL according to the first embodiment.

FIG. 8 illustrates a process performed by the PLL when the resistance value of the loop filter 30 is changed. In step S10, when receiving from an external control circuit a signal indicating that the reference frequency of the PLL is changed, or that the PLL is activated, the sequencer 60 inputs control signals to the multiplexers 70 and the switches 80 to interrupt the feedback loop. Then, in step S11, the sequencer 60 controls the turning-on/turning-off of the switches 32*a* to 32*e* (or 32*a* to 32*g*) provided in the loop filter 30. Next, in step S12, the resistance value of the resistance change device 31 is changed by applying electric-current to the loop filter 30 via the charge pump 20. Then, the sequencer 60 inputs control signals to the multiplexers 70 and the switches 80 to restore the feedback loop to a normal closed-loop state.

Figure 9:
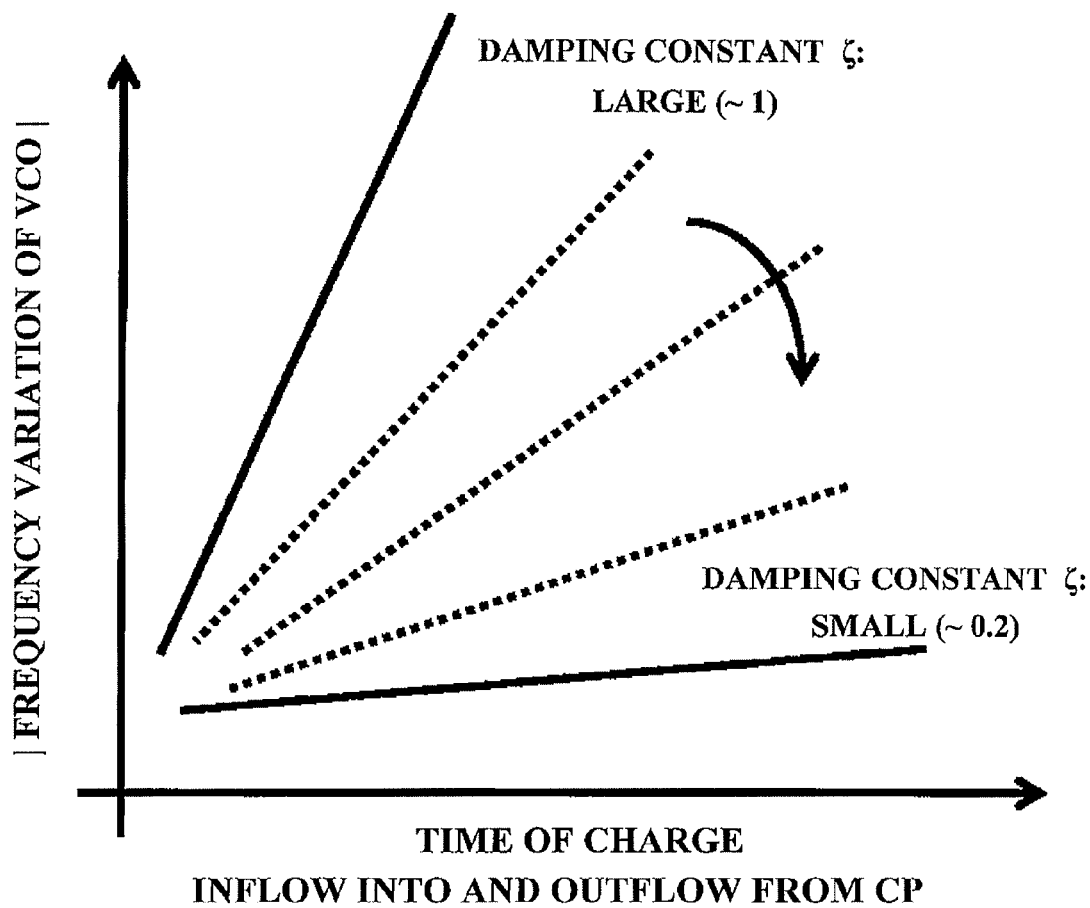
FIG. 9 illustrates the relationship between the damping constant of the PLL according to an embodiment and variation in the frequency of a VCO thereof.

Hereinafter, an appropriate method for determining the damping constant of the loop filter 30 is described. In order to maximize the value of $\zeta\omega_n$, given by Expression 4, it is advisable to make the loop filter 30 show high-speed response. FIG. 9 schematically illustrates the relationship between the damping constant $\zeta$ and the variation of the frequency of the VCO 40. As illustrated in FIG. 9, if the damping constant $\zeta$ is small, the feedback loop of the PLL is underdamped. The variation of the frequency of the VCO 40 is reduced in response to a pulse operation of the charge pump 20. Thus, the PLL operates stably. In contrast with this, if the damping constant $\zeta$ is large, the variation of the frequency of the VCO 40 is increased in response to a pulse operation of the charge pump 20. The damping action of the feedback loop of the PLL is enhanced. The convergence of the damped oscillation is enhanced. Consequently, the PLL is quickly locked up. Thus, when the PLL is unlocked, or when the electric-power of the PLL is turned on, it is desirable to set the damping constant as meeting the following Expression 5, thereby to avoid oscillation of the output signal of the PLL until the PLL is locked up. A settling time can be shortened at least by setting the damping constant at about 1.

$$\zeta = \frac{\sqrt{2}}{2} \quad \text{[Expression 5]}$$

The resistance value of the resistance change device 31 is set to be increased so that as the PLL approaches a lockup state, the damping constant $\zeta$ of the loop filter 30 is reduced. Consequently, phase noise and spurious signals can be suppressed from signals output therefrom to the phase detector 10. Accordingly, the PLL operates more stably.

Thus, when the PLL is unlocked, or when the power supply is turned on, the resistance value of the resistance change device 31 is set to be low. When the PLL is locked up, the resistance value of the resistance change device 31 is set to be high. Consequently, a PLL with stability and readiness can be provided. In addition, because the PLL according to the present embodiment uses the resistance change device, the resistance value thereof can be changed by the single device between the low-resistance state and the high-resistance state. (Modification 1)

Figure 10:
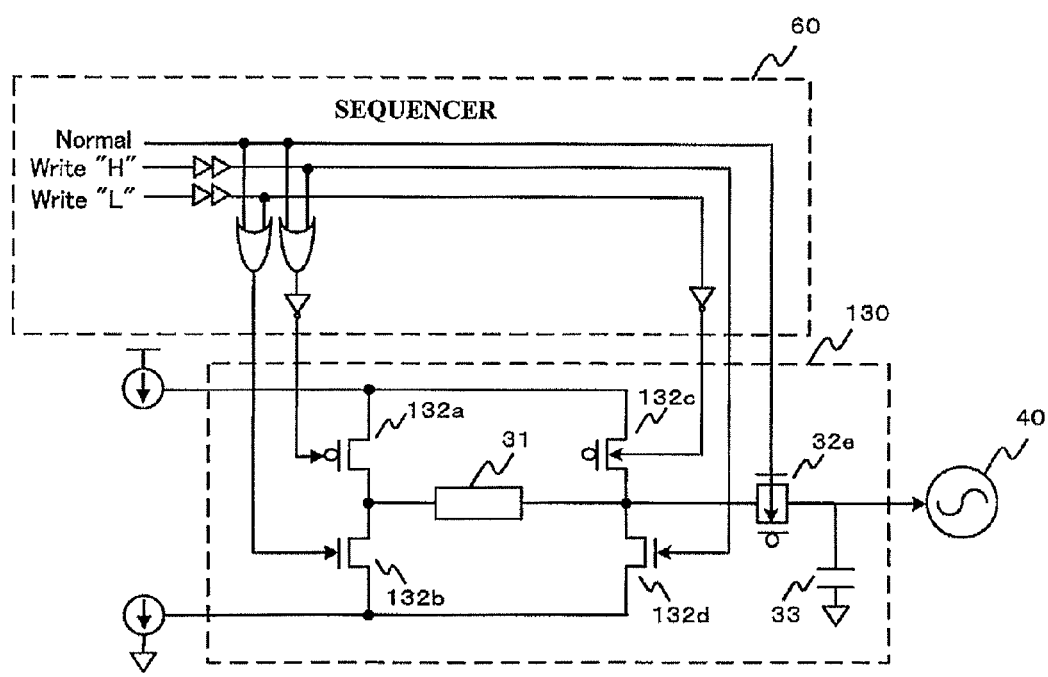
FIG. 10 illustrates a modification of the loop filter of the PLL according to the first embodiment.

In the description made with reference to FIG. 3, it has been described that each of the switches 32*a* to 32*d* in the loop filter 30 is configured using an nMOS and a pMOS. However, paths from the charge pump 20 are clearly differentiated into a charging one and a discharging one. Thus, as illustrated in FIG. 10, a pMOS and an nMOS can be used in the charging path and the discharging path, respectively. Thus, the number of circuit devices of the switch can be reduced. Although an nMOS and a pMOS can be used in the charging path and the discharging path, respectively, the on-state characteristic of each transistor is increased. Therefore, it is difficult to predict the characteristic of the loop filter. Accordingly, it is more preferable that a pMOS switch and an nMOS switch are used in the charging path and the discharging path, respectively.

An input signal input to the loop filter 130 from the sequencer 60 shown in FIG. 10 is the same as that input to the loop filter 30 described by referring to FIG. 3. When the PLL is unlocked, or when the power supply of the PLL is turned on, the sequencer 60 sets the signal-levels of the signals Normal, Write "H", and Write "L" at "L", "L", and "H", respectively. Then, switches 132b and 132c are turned on, while switches 132a and 132d are turned off. Thus, the resistance change device 31 is brought into a low-resistance state similar to the state described with reference to FIG. 4.

When the PLL is locked up, the sequencer 60 sets the signal-levels of the signals Normal, Write "H", and Write "L" at "L", "H", and "I,", respectively. Then, the switches 132a and 132d are turned on, while the switches 132b and 132c are turned off. Thus, the resistance change device 31 is brought into a high-resistance state similar to the state described with reference to FIG. 5.

In the normal state, the sequencer 60 sets the signal-levels of the signals Normal, Write "H", and Write "L" at "H", "L", and "L", respectively. Then, the switches 132a, 132b and 32e are turned on, while the switches 132c and 132d are turned off. Thus, the resistance change device 31 is brought into a state similar to the state described with reference to FIG. 6.

(Modification 2)

A three-terminal device can be used as the resistance change device. The three-terminal resistance change device has a terminal for writing a resistance value. A resistance value to be written to the resistance change device is determined according to the value input to this terminal.

Figure 11:
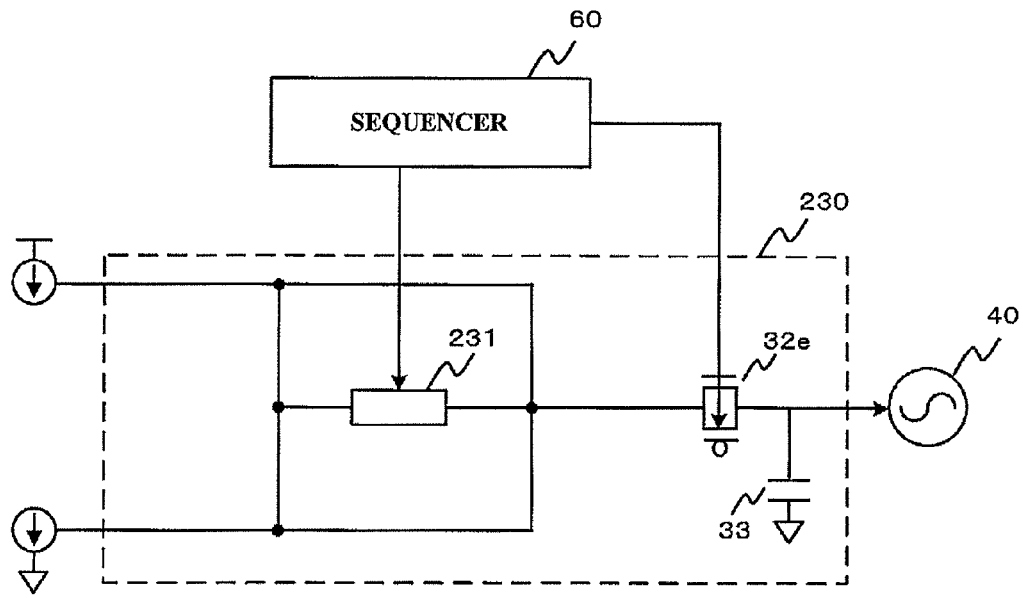
FIG. 11 illustrates a modification of the loop filter of the PLL according to the first embodiment.

FIG. 11 illustrates a loop filter 230 using a three-terminal resistance change device. A control signal is input to a three-terminal resistance change device 231 from the sequencer 60. The resistance value of the resistance change device 231 changes according to the control signal. When the resistance value of the resistance change device 231 is changed, the sequencer 60 turns off the switch 32e. In the normal state, the sequencer 60 controls the switch 32e so as to be turned on.

Thus, in the case of using the three-terminal resistance change device, the loop filter 230 doesn't need to be provided with the switches 32a to 32d needed in the loop filter 30 illustrated in FIG. 30.

(Modification 3)

Figure 12:
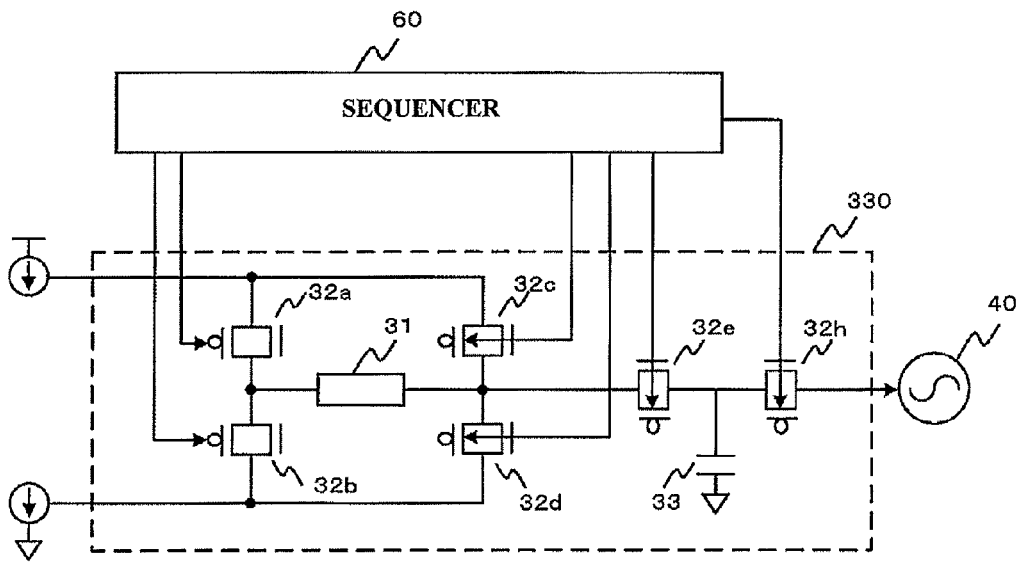
FIG. 12 illustrates a modification of the loop filter of the PLL according to the first embodiment.

The loop filter can be configured as illustrated in FIG. 12 to prevent the electric-potential $V_{VCO}$ of the VCO 40 from being discharged when the power supply of the PLL is turned off. The loop filter 330 illustrated in FIG. 12 is configured by adding a switch 32h to the loop filter 30 illustrated in FIG. 3. The sequencer 60 controls the switches 32e and 32h to be turned off when the power supply of the PLL is turned off. Consequently, the loop filter 330 can retain electric charge stored in the capacitor 33. Thus, because the PLL is in a state in which a certain amount of electric charge is stored in the capacitor 33 when the power supply is turned on again, the PLL can quickly be locked up. However, in order to turn off the switches 32e and 32h when the power supply of the PLL is turned off, it is necessary to apply a voltage to the sequencer 60. If a resistance change device whose resistance is infinitive is used as each of the switches 32e and 32h, the power supply of the sequencer 60 can be turned off when the power supply of the PLL is turned off.

In the foregoing description, the present embodiment and the modifications thereof have been described. The present embodiment can appropriately be changed to modifications other than the above Modifications 1 to 3 without departing from the spirit of the invention. For example, switches and an inrush resistance can be provided in each of Modifications 1 to 3, as illustrated in FIG. 7, to prevent erroneous writing. Alternatively, some of Modifications 1 to 3 and other modifications can be combined with one another.

Second Embodiment

Figure 13:
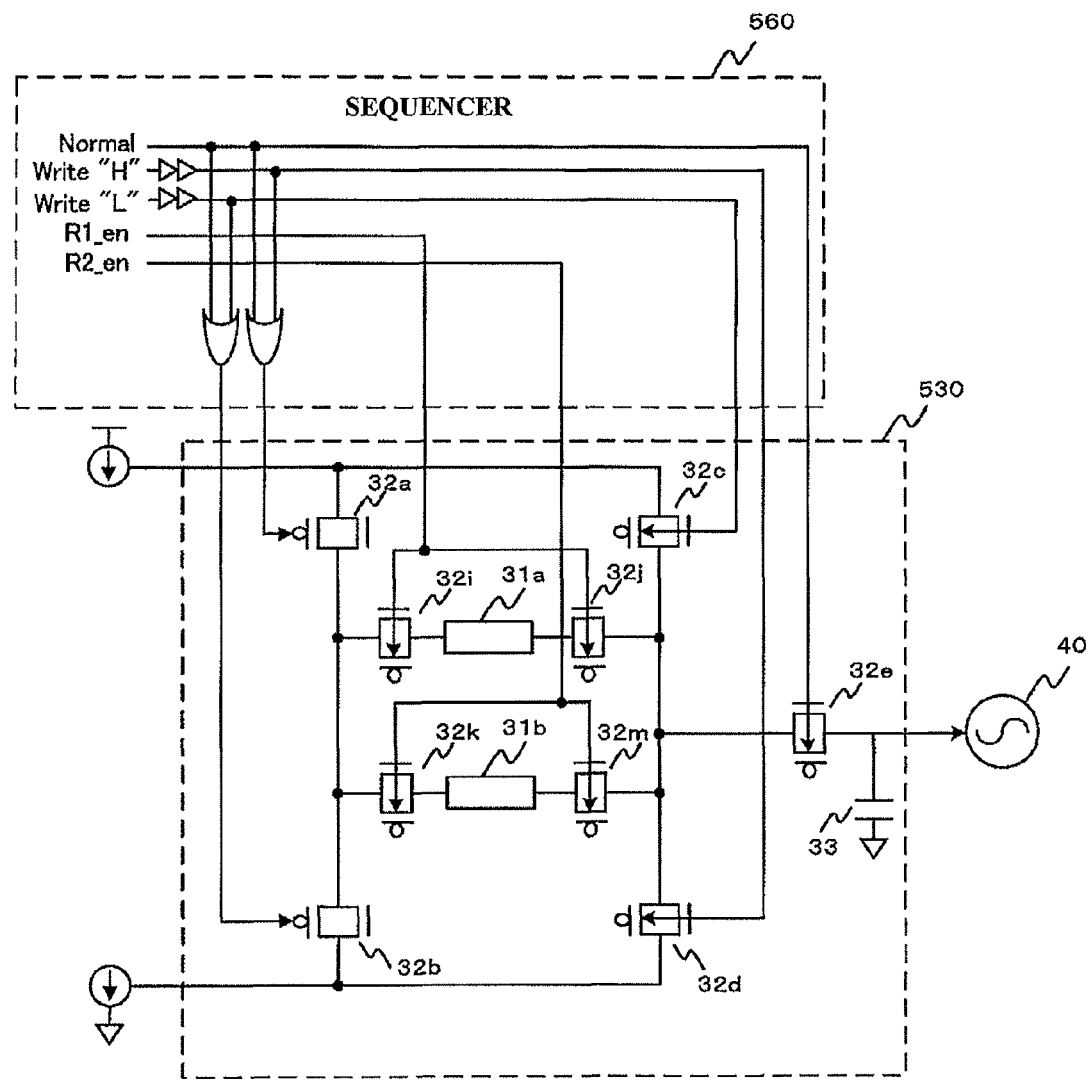
FIG. 13 illustrates a loop filter of a PLL according to a second embodiment.

The present embodiment is an embodiment in the case of provided plural resistance change devices in the loop filter. FIG. 13 illustrates a loop filter 530 and a sequencer 560 of a PLL according to the present embodiment. Other components of the PLL according to the present embodiment are similar to the corresponding ones according to the first embodiment. Thus, the description thereof is omitted. Incidentally, FIG. 13 illustrates a signal applied to the nMOS of each of switches 32a to 32m, similarly to FIG. 3. However, a signal applied to the pMOS thereof is omitted. The reversal value of a value represented by the signal input to the nMOS thereof is applied to the pMOS thereof.

FIG. 13 illustrates the loop filter 530, in which two resistance change devices are arranged in parallel to each other, by way of example. In the loop filter 530, switches 32i and 32j are provided at both ends of the first resistance change device 31a, respectively. Switches 32k and 32m are provided at both ends of the second resistance change device 31b, respectively. The switches 32i, 32j, 32k, and 32m are turned on/off according to control signals input from the sequencer 560. A signal R1_en is input to the switches 32i and 32j from the sequencer 560. If the signal-level of the signal R1_en is "H", the switches 32i and 32j are turned on. A signal R2_en is input to the switches 32k and 32m from the sequencer 560. If the signal-level of the signal R2_en is "H", the switches 32k and 32m are turned on.

It can be selected by these switches whether electric-current is applied to the first resistance change device 31a, and whether electric-current is applied to the second resistance change device 31b. Hereinafter, a state in which the switches 32i and 32j provided at both ends of the resistance change device 31a are turned off, and a state in which the switches 32k and 32m provided at both ends of the resistance change device 31b are turned off, are referred to as a state in which the resistance change device is turned off. On the other hand, a state in which the switches 32i and 32j provided at both ends of the resistance change device 31a are turned on, and a state in which the switches 32k and 32m provided at both ends of the resistance change device 31b are turned on, are referred to as a state in which the resistance change device is turned on.

FIG. 14 illustrates the combinations of the states of the first resistance change device 31a and the second resistance change device 31b. Each of the first resistance change device 31a and the second resistance change device 31b can be put into a high-resistance state, a low-resistance state, and an off-state. If both of the first resistance change device 31a and the second resistance change device 31b are in an on-state, the resistance value of the loop filter 530 is that of a combined resistance of the first resistance change device 31a and the second resistance change device 31b.

If all the resistance values in the high-resistance state and the low-resistance state of the first resistance change device 31a and the second resistance change device 31b differ from one another, the resistance values respectively corresponding to eight conditions (i.e., Condition 1 to 8 shown in FIG. 14) of the resistance to electric-current flowing between the charge pump 20 and the loop filter 530 differ from one another.

Utilizing this, the resistance value of the loop filter 530 can be set to be low when the PLL is unlocked, or when the power supply of the PLL is turned on, and to increase step by step as the PLL approaches a stable state.

For example, a time elapsed since the PLL is unlocked, or since the power supply of the PLL is turned on is measured by counting clock-cycles from the reference frequency of a signal input to the PLL. Then, as illustrated in FIG. 15, the elapsed time is divided into stages at every predetermined elapsed-time Δt. Then, the resistance values of the first resistance change device 31a and the second resistance change device 31b and the on-states or off-states of the switches provided at both ends of each of the resistance change devices 31a and 31b are changed such that the resistance value of the loop filter 530 increases every time the PLL passes the stages. For example, at a first stage, the resistance change devices are set to be in Condition 8 shown in FIG. 14. Then, at a second stage, the resistance change devices are set to be in Condition 6. Next, at a third stage, the resistance change devices are set to be in Condition 4. Then, at a fourth stage, the resistance change devices are set to be in Condition 1. In the sequencer 560, a nonvolatile lookup table can be provided. Then, the state to be set at each stage can preliminarily be set in the lookup table.

An output of the phase detector 10 can be input to the sequencer 560. In addition, the resistance value of the loop filter 530 can be changed step by step according to temporal variation of phase difference output by the phase detector 10.

In the cases of detecting the unlocked state of the PLL, and requesting the activation of the PLL from a state in which the power supply is turned off, the initial value of the resistance value of the loop filter 530 can be changed. For example, the state in which the unlocked state of the PLL is detected is considered to be closer to the stable state than that in which the activation of the PLL is requested. Thus, if the unlocked state of the PLL is detected, the initial value of the resistance value of the loop filter 530 is set to be high (e.g., Condition 5 shown in FIG. 14). If the activation of the PLL is requested, the initial value of the resistance value of the loop filter 530 is set to be low (e.g., Condition 8 shown in FIG. 14). Consequently, in the case where the activation of the PLL is requested, the PLL can be put into a lockup state more quickly. In the case where the unlocked state of the PLL is detected, the PLL can be operated more stably.

Figure 16:
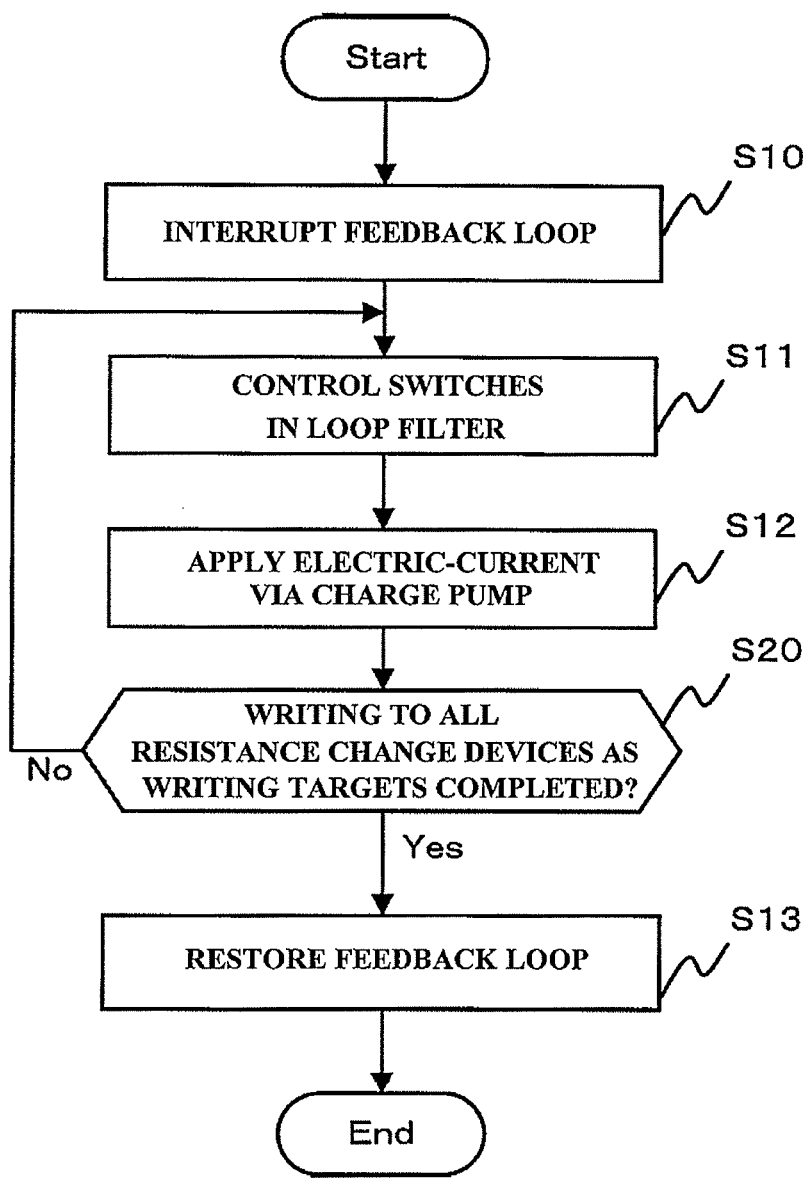
FIG. 16 illustrates a process in the PLL according to the second embodiment.

FIG. 16 shows a process flow illustrating a process performed by the PLL when the resistance value of the loop filter 530 is changed. In FIG. 16, each process which the same as that illustrated in FIG. 8 is designated with the same reference numeral used in FIG. 8. In step S11, when the resistance value of the loop filter 530 is changed, one of the resistance change devices, whose resistance value is changed, is selected using the switches 32i to 32m. As described in the first embodiment, the turning-on or turning-off of the switches 32a to 32e is controlled. Then, after the writing to the selected resistance change device is finished, if the writing to another of the resistance change devices is needed (No in step S20), the resistance change device is selected and the writing thereto is performed.

Figure 17:
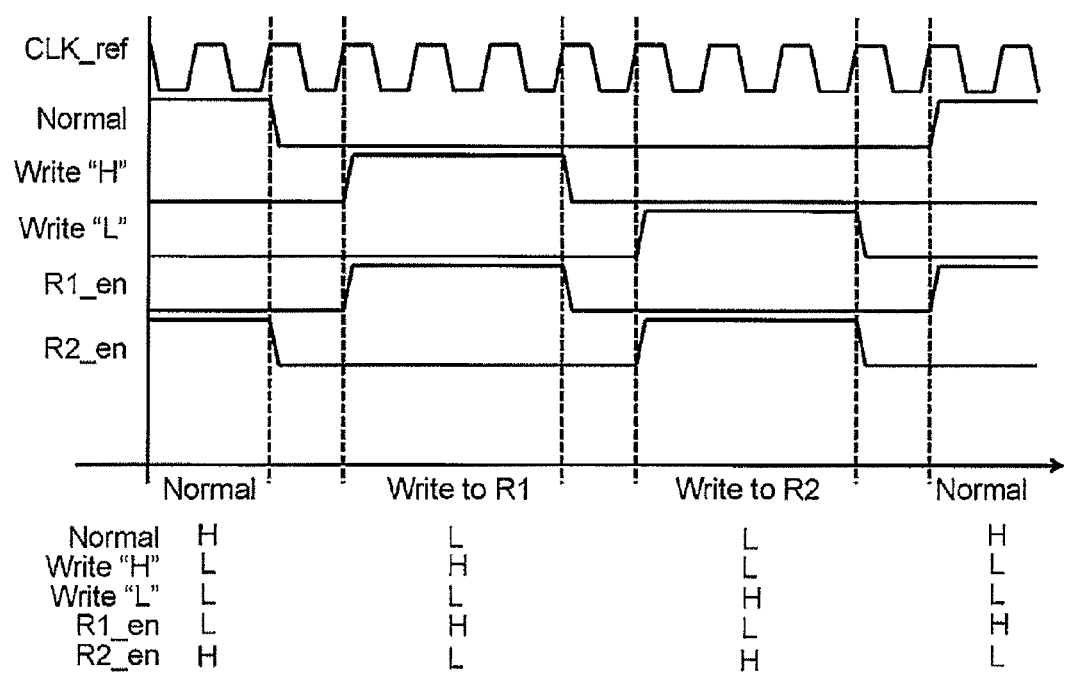
FIG. 17 illustrates a timing chart of a sequencer of the PLL according to the second embodiment.

FIG. 17 illustrates a timing chart of the sequencer 60. A signal CLK_ref represents a reference frequency input to the PLL. As illustrated in FIG. 17, in the normal state, the level of the signal Normal is set at "H". If the writing to the resistance change device is performed, the level of the signal Normal is set at "L". According to which of the resistance change devices the writing target is, the level of one of signals R1_en and R2_en is set at "H". The level of the other signal is set at "L". During a normal operation, the level of at least one of the signals R1_en and R2_en is set at "H", based on the lookup table provided in the sequencer 60.

Thus, according to the second embodiment, the resistance of the loop filter can finely be changed. In addition, according to the present embodiment, the resistance change devices are used. Thus, as compared with the case of using resistances each having a fixed resistance value, the resistance value of the loop filter can be controlled at finer levels.

(Modification 1)

Figure 18:
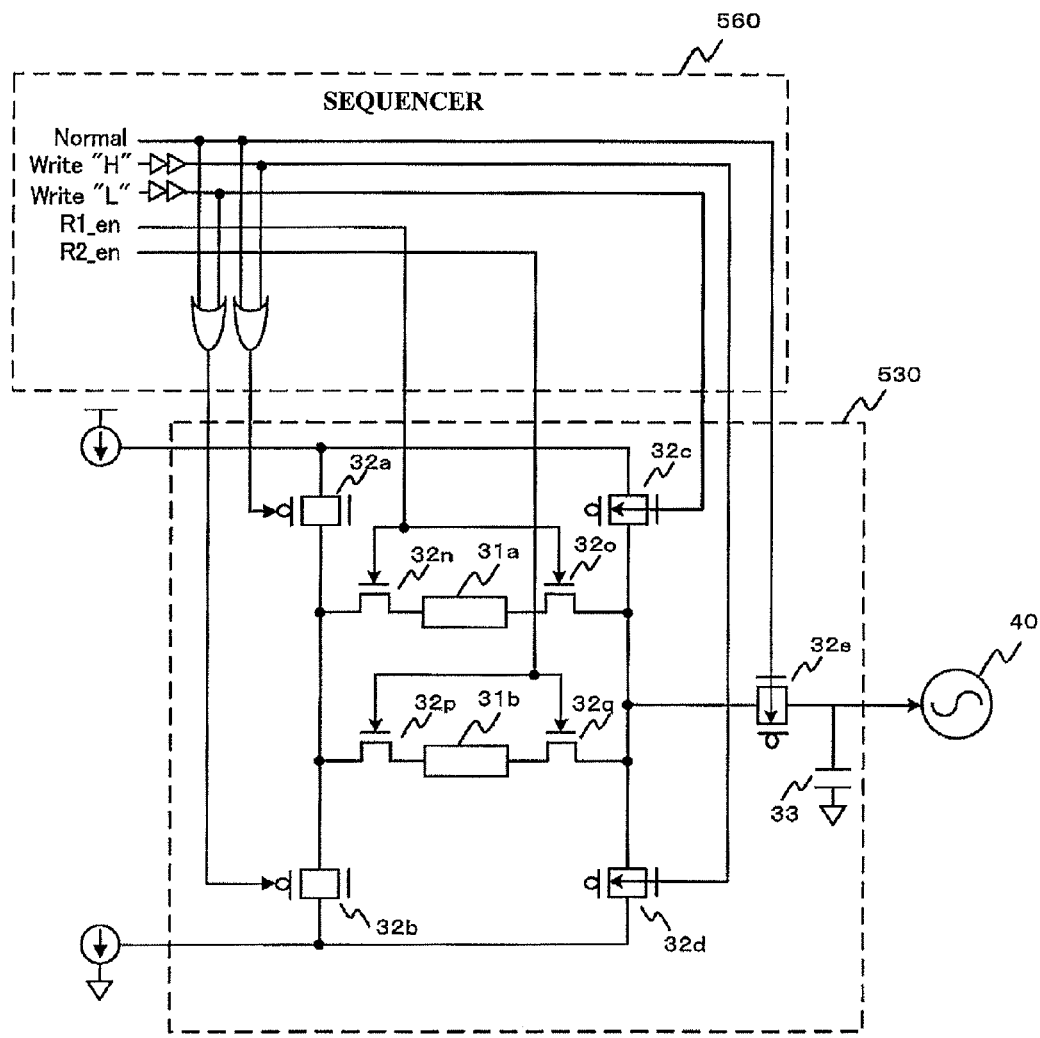
FIG. 18 illustrates a modification of the loop filter of the PLL according to the second embodiment.

In the description made with reference to FIG. 13, it has been described that the switches 32i, 32j, 32k, and 32m in the loop filter 30 use nMOSs and pMOSs. However, as illustrated in FIG. 18, these switches can be configured as nMOS switches 32n to 32q. Consequently, the number of circuit devices of each switch can be reduced. Incidentally, pMOS switches can be used instead of the nMOS switches 32n to 32q.

Also in the present embodiment, other various alterations thereof can be made. The modifications described in the first embodiment can be applied thereto. In the second embodiment, the example using the two resistance change devices has been described. However, three or more resistance change devices can be used. Incidentally, if the number of resistance change devices is increased, the number of switches provided at both ends of each of the resistance change devices increases. Thus, the junction capacitance of transistors configuring the switches may affect the gain of the loop filter. Therefore, preferably, the number of the resistance change devices connected in parallel with one another is equal to or less than 4.

The invention is not limited to the above embodiments. The embodiments will be appropriately changed without departing from the scope of the invention.

The invention claimed is:

1. A phase-locked loop (PLL), comprising:
    a phase detector configured to detect a phase difference between a reference signal and a feedback signal and output a first signal based on the phase difference;
    a charge pump configured to generate electric-current based on the first signal;
    a loop filter, connected to the charge pump, configured to output a second signal converted from the electric current, the loop filter having a first resistance change device;
    a voltage-controlled oscillator (VCO) configured to control an output frequency thereof according to the second signal input thereto from the loop filter;
    a frequency divider configured to perform frequency-dividing of an output signal of the VCO and to generate the feedback signal to be input to the phase detector; and
    a sequencer configured to control the loop filter such that:
        a resistance value of the first resistance change device is set to a first resistance value, upon receipt of a signal indicating turning on of the power supply of the PLL or a signal indicating turning off of the power supply of the PLL; and
        the resistance value of the first resistance change device is set to a second resistance value which is higher than the first resistance value upon detection of convergence of the output frequency to a predetermined range;
    wherein the loop filter further has:

a first switch and a second switch connected to a first end of the charge pump;

a third switch connected between a second end of the charge pump and the first switch; and a fourth switch connected between the second end of the charge pump and the second switch, wherein the first resistance change device has one end connected to the first switch and the third switch and the other end connected to the second switch and the fourth switch; and wherein the sequencer supplies control signals to the first to fourth switches in accordance with the resistance value to be written to the first resistance change device.

2. The PLL of claim 1, further comprising:

a fifth switch provided between the VCO and the frequency divider; and a sixth switch provided between the frequency divider and the first resistance change device; and wherein, when the resistance value is written to the first resistance change device, the sequencer supplies the control signal to turn off the fifth switch and the sixth switch.

3. The PLL of claim 1, wherein, in a normal state in which the resistance value of the first resistance change device is not changed, the sequencer turns on the first switch and the third switch, and turns off the second switch and the fourth switch.

4. The PLL of claim 1, wherein the sequencer supplies the control signals to turn on the first switch and the fourth switch when the first resistance value is written to the first resistance change device, and to turn on the second switch and the third switch when the second resistance value is written to the first resistance change device.

5. The PLL of claim 1, further comprising:

a fifth switch provided between the charging side of the charge pump and the first switch;

a first inrush resistance provided in parallel to the fifth switch;

a sixth switch provided between the discharging side of the charge pump and the third switch; and a second inrush resistance provided in parallel to the sixth switch, wherein the sequencer supplies, to the fifth switch and the sixth switch, control signals to control turning-on/turning-off thereof, according to whether the resistance value is written to the first resistance change device.

6. The PLL of claim 1, further comprising:

a fifth switch connected to the first resistance change device, the second switch and the third switch;

an sixth switch connected to the seventh switch; and a capacitor connected to the fifth switch and the sixth switch; and wherein the sequencer turns off the fifth switch and the sixth switch when receiving a signal instructing turning-off of the power supply of the PLL.

7. The PLL of claim 1, further comprising:

multiplexers provided between the phase detector and the charge pump, and wherein the sequencer controls the multiplexers to interrupt connection between the phase detector and the charge pump when a resistance value is written to the first resistance change device.

8. The PLL of claim 1, further comprising:

a second resistance change device provided in parallel to the first resistance change device;

a fifth switch and a sixth switch, provided at both ends of the first resistance change device, respectively; and an seventh switch and a eighth switch, provided at both ends of the second resistance change device, respectively, and wherein, at every lapse of a predetermined time since the power supply of the PLL is turned on, the sequencer outputs control signals to control turning-on/turning-off of the fifth switch and the sixth switch, turning-on/turning-off of the seventh switch and the eighth switch, and at least one of the resistance value of the first resistance change device and a resistance value of the second resistance change device.

9. The PLL of claim 1, wherein the first switch and the second switch are field-effect transistors having a first electrical-conductivity type, and wherein the third switch and the fourth switch are field-effect transistors having a second electrical-conductivity type differing from the first electrical-conductivity type.

* * * * *